(12) United States Patent
Munro et al.

(10) Patent No.: US 7,790,634 B2
(45) Date of Patent: Sep. 7, 2010

(54) METHOD FOR DEPOSITING AND CURING LOW-K FILMS FOR GAPFILL AND CONFORMAL FILM APPLICATIONS

(75) Inventors: Jeffrey C. Munro, Santa Clara, CA (US); Srinivas D. Nemani, Sunnyvale, CA (US)

(73) Assignee: Applied Materials, Inc, Santa Clara, CA (US)

( * ) Notice: Subject to any disclaimer, the term of this patent is extended or adjusted under 35 U.S.C. 154(b) by 11 days.

(21) Appl. No.: 11/753,918

(22) Filed: May 25, 2007

(65) Prior Publication Data

US 2008/0026597 A1    Jan. 31, 2008

Related U.S. Application Data

(60) Provisional application No. 60/803,489, filed on May 30, 2006.

(51) Int. Cl.
*H01L 21/31* (2006.01)
*H01L 21/469* (2006.01)

(52) U.S. Cl. .................. 438/789; 438/794; 438/793; 257/E21.489; 257/E21.493; 257/E21.478

(58) Field of Classification Search ................. 438/789, 438/794, 793; 257/E21.489, E21.493, E21.494, 257/E21.478
See application file for complete search history.

(56) References Cited

U.S. PATENT DOCUMENTS

| | | | |
|---|---|---|---|
| 4,147,571 | A | 4/1979 | Stringfellow et al. |
| 4,816,098 | A | 3/1989 | Davis et al. |
| 4,818,326 | A | 4/1989 | Liu et al. |
| 5,016,332 | A | 5/1991 | Reichelderfer et al. |
| 5,110,407 | A | 5/1992 | Ono et al. |
| 5,426,076 | A | 6/1995 | Moghadam |
| 5,558,717 | A | 9/1996 | Zhao et al. |

(Continued)

FOREIGN PATENT DOCUMENTS

DE    19654737 A1    7/1997

(Continued)

OTHER PUBLICATIONS

PCT International Search Report and Written Opinion mailed on Jul. 30, 2008 by the European Patent Office, International Application No. PCT/US2007/081139, 19 pages.

(Continued)

*Primary Examiner*—Caridad M Everhart
(74) *Attorney, Agent, or Firm*—Townsend and Townsend and Crew

(57) ABSTRACT

Methods of making a silicon oxide layer on a substrate are described. The methods may include forming the silicon oxide layer on the substrate in a reaction chamber by reacting an atomic oxygen precursor and a silicon precursor and depositing reaction products on the substrate. The atomic oxygen precursor is generated outside the reaction chamber. The methods also include heating the silicon oxide layer at a temperature of about 600° C. or less, and exposing the silicon oxide layer to an induced coupled plasma. Additional methods are described where the deposited silicon oxide layer is cured by exposing the layer to ultra-violet light, and also exposing the layer to an induced coupled plasma.

32 Claims, 8 Drawing Sheets

U.S. PATENT DOCUMENTS

| | | | |
|---|---|---|---|
| 5,587,014 A | 12/1996 | Leychika et al. | |
| 5,622,784 A | 4/1997 | Okaue et al. | |
| 5,635,409 A | 6/1997 | Moslehi | |
| 5,786,263 A | 7/1998 | Perera | |
| 5,853,607 A | 12/1998 | Zhao et al. | |
| 5,937,308 A | 8/1999 | Gardner et al. | |
| 5,937,323 A | 8/1999 | Orczyk et al. | |
| 6,009,830 A | 1/2000 | Li et al. | |
| 6,024,044 A | 2/2000 | Law et al. | |
| 6,087,243 A | 7/2000 | Wang | |
| 6,090,723 A | 7/2000 | Thakur et al. | |
| 6,140,242 A | 10/2000 | Oh et al. | |
| 6,146,970 A | 11/2000 | Witek et al. | |
| 6,156,581 A | 12/2000 | Vaudo et al. | |
| 6,165,834 A | 12/2000 | Agarwal et al. | |
| 6,207,587 B1 * | 3/2001 | Li et al. | 438/769 |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,566,278 B1 | 5/2003 | Harvey et al. | |
| 6,596,654 B1 * | 7/2003 | Bayman et al. | 438/788 |
| 6,614,181 B1 | 9/2003 | Harvey et al. | |
| 6,630,413 B2 | 10/2003 | Todd | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2 | 4/2004 | O'Neill et al. | |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,867,086 B1 | 3/2005 | Chen et al. | |
| 6,890,403 B2 | 5/2005 | Cheung | |
| 6,900,067 B2 | 5/2005 | Kobayashi et al. | |
| 6,955,836 B2 * | 10/2005 | Kumagai et al. | 427/579 |
| 6,958,112 B2 | 10/2005 | Karim et al. | |
| 7,018,902 B2 | 3/2006 | Visokay et al. | |
| 7,084,076 B2 | 8/2006 | Park et al. | |
| 7,115,419 B2 | 10/2006 | Suzuki | |
| 7,148,155 B1 * | 12/2006 | Tarafdar et al. | 438/778 |
| 7,205,248 B2 | 4/2007 | Li et al. | |
| 7,220,461 B2 | 5/2007 | Hasebe et al. | |
| 7,399,388 B2 * | 7/2008 | Moghadam et al. | 204/192.37 |
| 7,419,903 B2 | 9/2008 | Haukka et al. | |
| 7,435,661 B2 | 10/2008 | Miller et al. | |
| 7,498,273 B2 | 3/2009 | Mallick et al. | |
| 7,541,297 B2 | 6/2009 | Mallick et al. | |
| 2001/0021595 A1 | 9/2001 | Jang et al. | |
| 2001/0029114 A1 * | 10/2001 | Vulpio et al. | 438/794 |
| 2001/0038919 A1 | 11/2001 | Berry et al. | |
| 2001/0054387 A1 | 12/2001 | Frankel et al. | |
| 2002/0048969 A1 | 4/2002 | Suzuki et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0064154 A1 | 4/2003 | Laxman et al. | |
| 2003/0118748 A1 | 6/2003 | Kumagai et al. | |
| 2003/0124873 A1 * | 7/2003 | Xing et al. | 438/770 |
| 2003/0143841 A1 | 7/2003 | Yang et al. | |
| 2003/0159656 A1 | 8/2003 | Tan et al. | |
| 2003/0172872 A1 | 9/2003 | Thakur et al. | |
| 2003/0232495 A1 | 12/2003 | Moghadam et al. | |
| 2004/0008334 A1 | 1/2004 | Sreenivasan et al. | |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 * | 8/2004 | Li et al. | 438/789 |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 * | 9/2004 | Tanabe et al. | 438/487 |
| 2004/0241342 A1 | 12/2004 | Karim et al. | |
| 2005/0001556 A1 | 1/2005 | Hoffman et al. | |
| 2005/0019494 A1 | 1/2005 | Moghadam et al. | |
| 2005/0062165 A1 | 3/2005 | Saenger et al. | |
| 2005/0087140 A1 * | 4/2005 | Yuda et al. | 118/723 ME |
| 2005/0181555 A1 | 8/2005 | Haukka et al. | |
| 2005/0186731 A1 | 8/2005 | Derderian et al. | |
| 2005/0196533 A1 | 9/2005 | Hasebe et al. | |
| 2005/0227499 A1 | 10/2005 | Park et al. | |
| 2005/0250340 A1 | 11/2005 | Chen et al. | |
| 2006/0011984 A1 | 1/2006 | Curie | |
| 2006/0014399 A1 | 1/2006 | Joe | |
| 2006/0030165 A1 | 2/2006 | Ingle et al. | |
| 2006/0055004 A1 | 3/2006 | Gates et al. | |
| 2006/0068599 A1 | 3/2006 | Baek et al. | |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0281496 A1 | 12/2006 | Cedraeus | |
| 2006/0286776 A1 | 12/2006 | Ranish et al. | |
| 2007/0020392 A1 | 1/2007 | Kobrin et al. | |
| 2007/0026689 A1 | 2/2007 | Nakata et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0181966 A1 | 8/2007 | Watatani et al. | |
| 2007/0232082 A1 | 10/2007 | Balseanu et al. | |
| 2007/0281495 A1 | 12/2007 | Mallick et al. | |
| 2007/0281496 A1 | 12/2007 | Ingle et al. | |
| 2008/0085607 A1 | 4/2008 | Yu et al. | |
| 2008/0102223 A1 | 5/2008 | Wagner et al. | |
| 2009/0061647 A1 | 3/2009 | Mallick et al. | |

FOREIGN PATENT DOCUMENTS

| | | |
|---|---|---|
| EP | 1717848 A | 11/2006 |
| JP | 01241826 A | 9/1989 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Gulleri, G. et al., "Deposition Temperature Determination of HDPCVD Silicon Dioxide Films," 2005, Microelectronic Engineering, vol. 82, pp. 236-241.

PCT International Search Report and Written Opinion mailed Jan. 6, 2009, International Application No. PCT/US08/82365, 12 pages.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 1, May 1, 1986, pp. 480-485.

* cited by examiner

METHOD FOR DEPOSITING AND CURING LOW-K FILMS FOR GAPFILL AND CONFORMAL FILM APPLICATIONS

CROSS-REFERENCES TO RELATED APPLICATIONS

This application claims the benefit of U.S. Provisional Application No. 60/803,489 by Munro et al, filed May 30, 2006 and titled "A METHOD FOR DEPOSITING AND CURING LOW-K FILMS FOR GAPFILL AND CONFORMAL FILM APPLICATIONS". This application is also related to co-assigned U.S. Provisional App. No. 60/803,493, by Ingle et al, filed May 30, 2006 and titled "CHEMICAL VAPOR DEPOSITION OF HIGH QUALITY FLOW-LIKE SILICON DIOXIDE USING A SILICON CONTAINING PRECURSOR AND ATOMIC OXYGEN". This application is also related to U.S. Provisional Application No. 60/803,481, by Chen et al, filed May 30, 2006 and titled "A NOVEL DEPOSITION-PLASMA CURE CYCLE PROCESS TO ENHANCE FILM QUALITY OF SILICON DIOXIDE". In addition, this application is related to U.S. Provisional Application No. 60/803,499 by Lubomirsky, filed May 30, 2006 and titled "PROCESS CHAMBER FOR DIELECTRIC GAPFILL". The entire contents of the priority U.S. Provisional patent application and the related applications are herein incorporated by reference for all purposes.

BACKGROUND OF THE INVENTION

In depositions of dielectric films, it is often desirable to form a highly conformal layer that has good insulating properties (i.e., a low k-value), and good film quality (e.g., a high film density, and low wet etch rate ratio (WERR)). Unfortunately, there are few (if any) starting materials that combine all these qualities in a simple deposition. In silicon oxide dielectric depositions, highly conformal films typically have good flow characteristics that allow the film to migrate into gaps, voids and seams. However, oxide films with good flow characteristics also tend to have high water and silanol (i.e., Si—OH) concentrations, which increase the k-value and WERR of the film. On the other hand, depositions of low-moisture oxide films typically have lower k-values and WERRs, but are also more prone to forming gaps and seams due to their reduced flowability.

One way to mitigate the deficiencies between high and low moisture silicon oxide films, is first to deposit a conformal high moisture film and then anneal it to remove at least a portion of the water. Two conventional annealing methods are: (1) high-temperature thermal annealing, and (2) high-density plasma annealing. In a thermal anneal, the deposited oxide layer is raised to a temperature where a significant amount of moisture is evaporated out of the layer. Silanol groups are also broken down into water and Si—O bonds, with at least some of this water also escaping from the oxide layer. The result is an annealed silicon oxide layer that is more dense and more electrically insulating (i.e., having a lower k-value) than the initially deposited oxide film.

Conventional thermal anneals are more efficient when the anneal temperature is higher. A high-temperature anneal at over 1000° C. breaks down silanol bonds and evaporates moisture from a deposited oxide layer at a significantly higher rate than a 300° C. anneal. The higher removal rate shortens the anneal time and increases the efficiency of the anneal step. However, higher temperature anneals have to be balanced against thermal budget constraints in the fabrication process. For example, if the thermal anneal is being performed on an inter-metal dielectric (IMD) layer deposited over metal lines, the temperature ceiling for the anneal may be 400° C. or less. In some instances, thermal budgets that low can make thermal annealing impractical due to the long anneal times.

When high-temperature anneals are impractical, a second annealing method involving a high-density plasma may be used. In this method, the initially deposited silicon oxide layer is exposed to a high-density plasma typically formed from the breakdown of inert gases like helium and argon. Charged particles from the plasma strike the oxide film and cause the disruption of silanol bonds and removal of water vapor. Anneal temperatures in high-density plasma are generally lower than for thermal anneals, and can be used to anneal oxide films with low thermal budget constraints.

The highly energetic plasma particles can also disrupt carbon-silicon and carbon-carbon bonds in the oxide film. When depositing a pure silicon oxide layer, the breakdown and removal of carbon is a desirable outcome for a plasma anneal. However, for low-k oxide films that incorporate carbon to lower the dielectric constant of the material, carbon removal by the plasma can damage the film by increasing its k-value. Thus, there is a need for additional annealing methods that can efficiently cure dielectric films at low temperatures without adversely affecting the dielectric constant of low-k materials. This and other issues are addressed by embodiments of the present invention.

BRIEF SUMMARY OF THE INVENTION

Embodiments of the invention include methods of making a silicon oxide layer on a substrate. The methods may include forming the silicon oxide layer on the substrate in a reaction chamber by reacting an atomic oxygen precursor and a silicon precursor and depositing reaction products on the substrate. The atomic oxygen precursor may be generated outside the reaction chamber. The methods may also include heating the silicon oxide layer at a temperature of about 600° C. or less, and exposing the silicon oxide layer to an induced coupled plasma.

Embodiments of the invention also include methods of forming a silicon oxide layer on a substrate. The methods may include forming the silicon oxide layer on the substrate in a reaction chamber by reacting an atomic oxygen precursor and a silicon precursor and depositing reaction products on the substrate. The atomic oxygen precursor may be generated outside the reaction chamber. The methods may also include exposing the silicon oxide layer to ultra-violet light, and exposing the silicon oxide layer to an induced coupled plasma.

Embodiments of the invention still further include methods of depositing and annealing a silicon oxide layer on a wafer substrate. The methods may include providing the substrate wafer to an HDP-CVD process chamber where the deposition of the silicon oxide layer occurs, and providing a remote plasma generation unit outside the HDP-CVD process chamber. The remote plasma generation unit may be used to generate an atomic oxygen precursor that is supplied to the HDP-CVD process chamber. The methods may also include supplying a silicon precursor to the HDP-CVD process chamber, where the silicon precursor and the atomic oxygen precursor react to form the silicon oxide layer on the wafer. After the silicon oxide layer is formed, a first anneal may be performed on the deposited silicon oxide layer, where the first anneal includes heating the layer to a temperature of about 300° C. to about 600° C. for about 1 minute to about 30 minutes. Then, a second anneal may be performed on the deposited oxide layer, where the second anneal includes exposing the layer to a high-density argon plasma for about 1 minute to about 10 minutes.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for multistage anneals of silicon oxide layers. The multistage anneal permits the efficient removal of moisture and silanol groups from an oxide layer without requiring high temperatures (e.g., temperatures in excess of 600° C.). The multistage anneal may include a first stage anneal that increases the hardness of the layer and removes a portion of the moisture and/or hydroxyl groups, and a second stage anneal that removes most (if not all) the remaining moisture and hydroxyl groups to produce a hard oxide layer (e.g., greater than 1 GPa) with good dielectric characteristics (e.g., k-value less than 3).

The multistage anneals can transform an initially deposited soft oxide film into a high-quality, low-k dielectric layer without requiring high temperatures or long anneal times (e.g., greater than 60 minutes). For carbon containing low-k oxide layers, the first stage of the anneal hardens the soft film to the point that a subsequent anneal stage (or stages) does not break down and remove enough carbon to raise significantly the k-value of the layer. Thus, low-temperature and highly efficient moisture removal anneal methods such as high-density plasma anneals may be used in the anneal process without compromising the low-k characteristics of carbon containing silicon oxide dielectric layers.

Exemplary Oxide Layer Deposition and Anneal Processes

Figure 1:
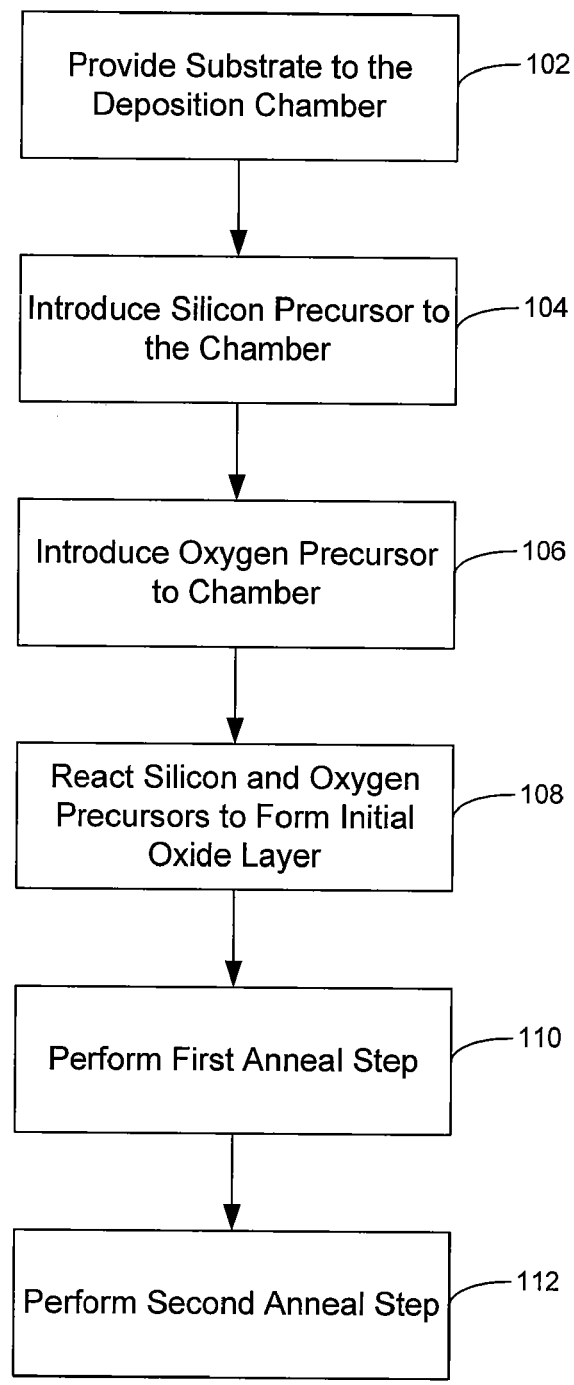
FIG. 1 is a flowchart showing selected steps in a dielectric deposition and anneal according to embodiments of the invention.

FIG. 1 shows a flowchart that has selected steps in a dielectric deposition and anneal method 100 according to embodiments of the invention. The method 100 may include providing a wafer substrate to a deposition chamber 102. Wafer substrates may include 200 mm, 300 mm, etc., silicon wafer substrates. The substrates may have structures formed thereon that include gaps, trenches, steps, etc., with aspect rations of 2:1 or more, 5:1 or more, 7:1 or more, 10:1 or more, 13:1 or more, 15:1 or more, and so on.

The silicon precursor may be introduced to the substrate containing reaction chamber 104. The silicon precursor may include one or more carbon-containing organo-silicon compound, and/or a non-carbon containing silicon compound such as silane ($SiH_4$). The organo-silicon containing compounds may include those with direct Si—C bonding and/or those with Si—O—C bonding. Examples of organosilane silicon precursors may include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane, and mixtures thereof, among others.

The organo-silicon precursor may be mixed with a carrier gas before or during its introduction to the deposition chamber. A carrier gas may be an inactive gas that does not unduly interfere with the formation of the oxide film on the substrate. Examples of carrier gases include helium, neon, argon, and hydrogen ($H_2$), among other gases.

An oxygen-containing precursor may also be introduced to the substrate containing reaction chamber 106. The oxygen containing precursor may include atomic oxygen that was remotely generated outside the deposition chamber. The atomic oxygen may be generated by the dissociation of a precursor such as molecular oxygen ($O_2$), ozone ($O_3$), an nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The dissociation of the precursor to generate the atomic oxygen may also be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor.

In embodiments of method 100, the atomic oxygen and organo-silicon precursors are not mixed before being introduced to the deposition chamber. The precursors may enter the chamber through separate spatially separated precursor inlets distributed around reaction chamber. For example, the atomic oxygen precursor may enter from an inlet (or inlets) at the top of the chamber and positioned directly above the substrate. The inlet directs the flow of the oxygen precursor in a direction perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

Additional embodiments include sending the atomic oxygen and silicon precursors through separate ports of a multi-port showerhead. For example, a showerhead positioned above the substrate may include a pattern of openings for the precursors to enter the deposition chamber. One subset of openings may be supplied by the atomic oxygen precursor, while a second subset of openings is supplied by the silicon precursor. Precursors traveling through different sets of opening may be fluidly isolated from each other until exiting into the deposition chamber. Additional details about types and designs of precursor handling equipment is described in a co-assigned U.S. Provisional Patent Application 60/803,489, by Lubomirsky, and titled PROCESS CHAMBER FOR DIELECTRIC GAPFILL", filed on May 30, 2006, the entire contents of which are hereby incorporated by reference for all purposes.7

As the atomic oxygen and silicon precursors react in the deposition chamber, they form the silicon oxide layer on the substrate deposition surface 108. During the initial deposition, the substrate may be held a constant and relatively low temperature (e.g., about 30° C. to about 70° C.). The initial oxide layer has excellent flowability, and can quickly migrate to the bottoms of the gaps in the structures on the substrate surface.

Following the deposition of the silicon oxide layer a first anneal may be performed 110 that removes a portion of the moisture and increases the hardness of the layer. This initial anneal step may include heating the oxide layer for about 1 minute to 10 minutes in an inert environment (e.g., a dry-$N_2$ environment). A thermal anneal temperature may be selected that will not damage metal lines formed in the substrate structure, such as when the oxide layer is an intermetal dielectric being deposited over an aluminum metal lines.

Alternatively (or in addition) the first anneal step may include exposing the silicon oxide layer to ultra-violet (UV) light for about 1 minute to about 30 minutes. Like the thermal anneal, a UV anneal may remove a portion of the moisture present in the initially deposited oxide film, and also increase the hardness of the film.

After termination of the first anneal, a second anneal step may be performed 112 to further remove moisture and silanol bonds from the oxide layer. In this anneal step 112, substantially all of the moisture and silanol may be removed to give the layer a lower k-value and lower WERR value than either the initially deposited oxide or after the layer was treated in the first anneal step. This second anneal may include exposing the oxide layer to a plasma that is efficient at removing water and silanol groups from the oxide. Following the first anneal, however, the oxide layer has sufficient hardness to reduce (or prevent) the plasma from disrupting the carbon groups present in the oxide. Thus, for low-k, carbon containing oxide layers, the plasma anneal does not remove enough carbon to increase significantly the k-value of the layer.

Figure 2:
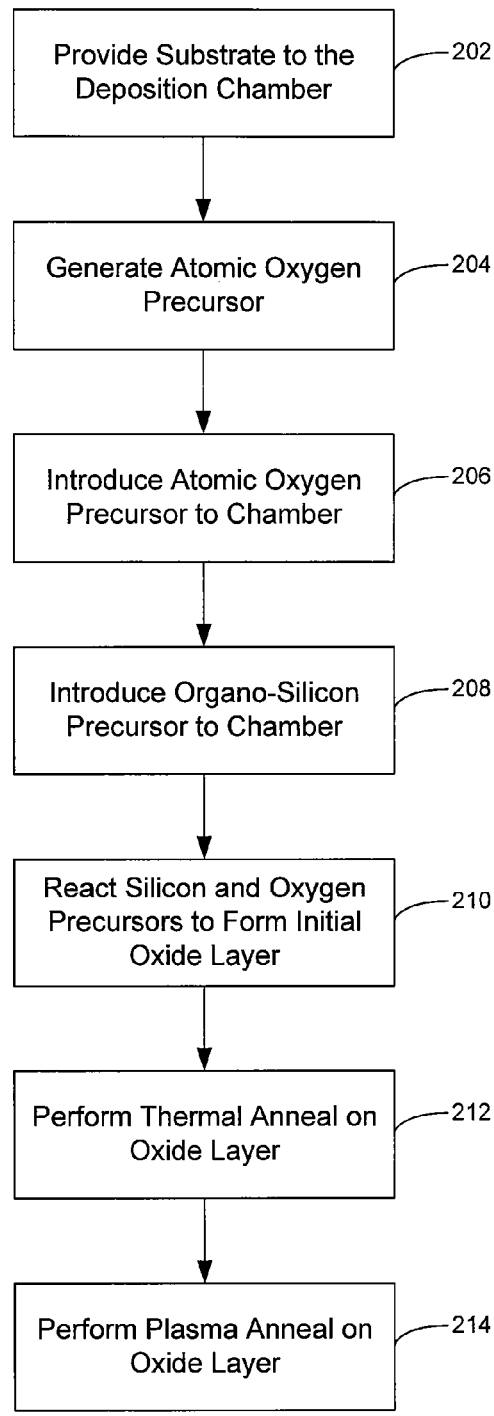
FIG. 2 is a flowchart showing selected steps in a dielectric deposition and thermal/plasma anneal according to embodiments of the invention.

Referring now to FIG. 2, a flowchart showing selected steps in a dielectric deposition and thermal/plasma anneal method 200 according to embodiments of the invention is shown. The method 200 includes providing a substrate to the deposition chamber 202. Then, deposition of the initial oxide layer include the generation of reactive atomic oxygen 204 in a remote system outside the reaction chamber. For example, the atomic oxygen may be generated in a remote high-density plasma generator supplying 4000 to 6000 Watts (e.g., 5500 Watts) of RF power to a combined gas stream of argon gas flowing at, for example, about 900 to 1800 sccm with molecular oxygen ($O_2$) flowing at, for example, about 600 to about 1200 sccm. The remotely generated atomic oxygen precursor may then be introduced into the reaction chamber 206.

An organo-silicon precursor is also introduced to the reaction chamber 208. This precursor may be introduced by mixing an organo-silicon compound (gas or liquid) with a carrier gas such as helium or molecular hydrogen ($H_2$). For example, helium may be bubbled at a flow rate of about 600 to about 2400 sccm through a room-temperature liquid organo-silicon precursor such as octamethylcyclotetrasiloxane (OMCTS) to provide a flow of OMCTS to the chamber at a rate of about 800 to about 1600 mgm.

The atomic oxygen and silicon precursors react with one another in the chamber to form the initial oxide layer on the substrate 210. The total pressure in the chamber during the oxide layer deposition may be, for example, about 0.5 Torr to about 6 Torr. Higher total pressures (e.g., 1.3 Torr) may deposit a oxide film with more flow-like qualities, while lower pressures (e.g., 0.5 Torr) may deposit a more conformal oxide layer. Because the atomic oxygen is highly reactive, the deposition temperature in the reaction chamber may be relatively low (e.g., about 100° C. or less). Oxide deposition rates may range from about 500 Å/min to about 3000 Å/min (e.g., 1500 Å/min). The thickness of the layer may be about 500 Å to about 5000 Å.

Following the deposition of the low-k, oxide film a thermal anneal is performed 212. This anneal may involve raising the temperature of the initially deposited oxide layer to about 300° C. to about 600° C. (e.g., about 350° C. to about 400° C.; about 380° C., etc.). The thermal anneal environment may include an inert atmosphere of dry nitrogen ($N_2$), helium, argon, etc., an the chamber pressure may be about 15 mTorr to about 760 Torr (e.g., about 50 Torr). The oxide layer may undergo the thermal anneal for about 1 minute to about 30 minutes (e.g., about 1 minute), and produce an annealed oxide layer with less moisture and a higher hardness than the initially deposited film. Because the thermal anneal does not completely remove the moisture and silanol, the layer's hardness is less than that of a completely dry, silanol-free oxide. For example, the post-thermal anneal film may have a hardness of about 0.5 GPa or less (e.g., 0.1 GPa to about 0.5 GPa). Similarly, the film's dielectric constant is normally higher than that of a completely dry oxide layer, and may have a post-thermal anneal k-value of greater than 4.0.

A second, plasma anneal may then be performed 214 on the thermally annealed oxide layer. The plasma anneal may be conducted by exposing the wafer substrate to a plasma generated from one or more inert gases such as helium or argon. The plasma may be generated by induced coupled plasma (ICP) and may be generated in situ in the reaction chamber. The RF power used to generate the plasma may be about 1000 Watts to about 9600 Watts (e.g., about 1800 Watts), and the plasma pressure in the chamber may be about 2 mTorr to about 50 mTorr (e.g., about 20 mTorr). The wafer may be heated from about 350° C. to about 400° C. (e.g., about 380° C.) during the plasma anneal, and the oxide layer may be exposed to the plasma for about 1 to about 10 minutes (e.g., about 3 minutes). The moisture and silanol concentrations in the layer are substantially close to zero following the plasma anneal. The hardness of the layer is substantially the same as that for a moisture and silanol free low-k silicon oxide (e.g., about 1.2 GPa). The layer may also have a WERR of less than 2:1 (e.g., about 1.8:1 to about 1.4:1). Similarly, the k-value for the layer may be less than 3.0. The annealed oxide layer may also be uniform and stable at the thermal budget temperatures of a metalized substrate (e.g., about 600° C.).

Figure 3:
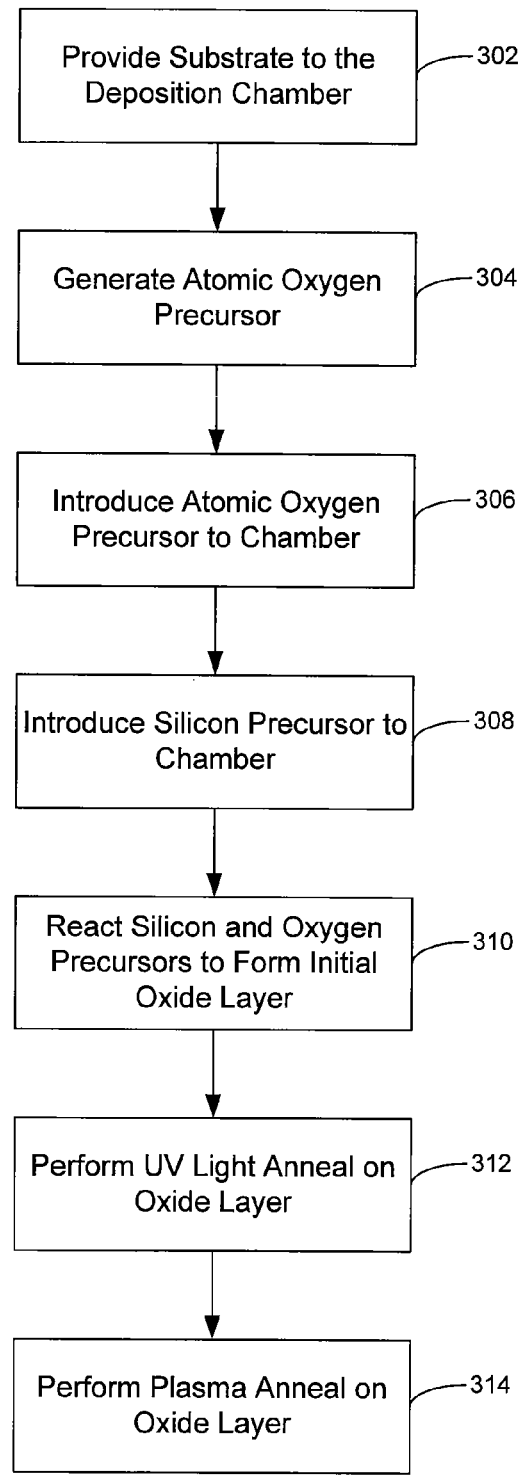
FIG. 3 is a flowchart showing selected steps in a dielectric deposition and UV/plasma anneal according to embodiments of the invention.

FIG. 3 shows a flowchart with selected steps in a dielectric deposition and UV/plasma anneal method 300 according to embodiments of the invention. Similar to method 200, the method 300 includes providing a substrate to the deposition chamber 302, and generating an atomic oxygen 304 precursor that is introduced into the deposition chamber 306. A silicon precursor (e.g., an organo-silicon compound) is also introduced to the chamber 308, and reacted with the atomic oxygen precursor to form an initial oxide layer 310. Following this initial deposition, a two step anneal is performed to remove moisture and silanol groups from the oxide layer.

The first anneal step includes exposing the initially deposited silicon oxide layer to ultra-violet light 312. The UV light can increase the hardness and lower the k-value of the film by removing moisture and breaking apart silanol (i.e., Si—OH) bonds. For example, Si—OH bonds absorb UV radiation at approximately 200 nm, which converts the silanol into silicon oxide and water vapor.

The UV light may be supplied from one or more UV light sources that shine light on the substrate. These UV light sources may include a UV lamp that emits light over a broad spectrum of wavelengths (including non-UV wavelengths) that has a peak intensity at a UV wavelength (e.g., 220 nm). Examples of UV lamps include xenon lamps (peak emission wavelength at 172 nm), mercury lamps (peak at 243 nm), deuterium lamps (peak at 140 nm), and krypton chloride ($KrCl_2$) lamps (peak at 222 nm), among other types of UV lamps. Additional UV light sources may include lasers that provide coherent, narrowband UV light to the oxide layer. Laser light sources may include Excimer lasers (e.g., a XeCl, KrF, $F_2$, etc., excimer laser) and/or appropriate harmonics of solid state lasers (e.g., Nd—YAG lasers). UV light sources may also include diode UV light sources.

Filters and/or monochrometers may be used to narrow the wavelength range of the light that reaches the oxide layer. For example, filters may block light with wavelengths less than 170 nm to keep the UV anneal from removing the carbon in the layer.

The oxide layer may be exposed to the UV light source from about 10 seconds to about 60 minutes. Typical exposure times may be from about 1 minute to about 10 minutes (e.g., about 2 minutes to about 5 minutes). The temperature of the oxide layer may be about 25° C. to about 900° C. during the UV anneal step. The UV exposure may be done while the oxide layer is in an atmosphere containing helium, argon, $N_2$, $N_2O$, ammonia, ozone, $H_2O$, or mixtures thereof. The pressure of the atmosphere in the chamber during the UV exposure may range from about 1 Torr to about 600 Torr.

Following the UV anneal, a plasma anneal may be performed on the oxide layer 314. This second anneal removes substantially all the remaining water and silanol groups to provide a high quality (e.g., hardness of 1.2 GPa), low-k (e.g., k-value of about 3.0 or less) silicon oxide layer. Similar to the plasma anneal 214 in method 200, the plasma anneal 314 may be conducted by exposing the wafer substrate to a plasma generated from one or more inert gases such as helium or argon. The plasma may be generated by induced coupled plasma (ICP) and may be generated in situ in the reaction chamber. The wafer may be heated from about 350° C. to about 400° C. during the plasma anneal, and the oxide layer may be exposed to the plasma for about 1 to about 10 minutes. The moisture and silanol concentrations in the layer are substantially close to zero following the anneal.

Figure 4:
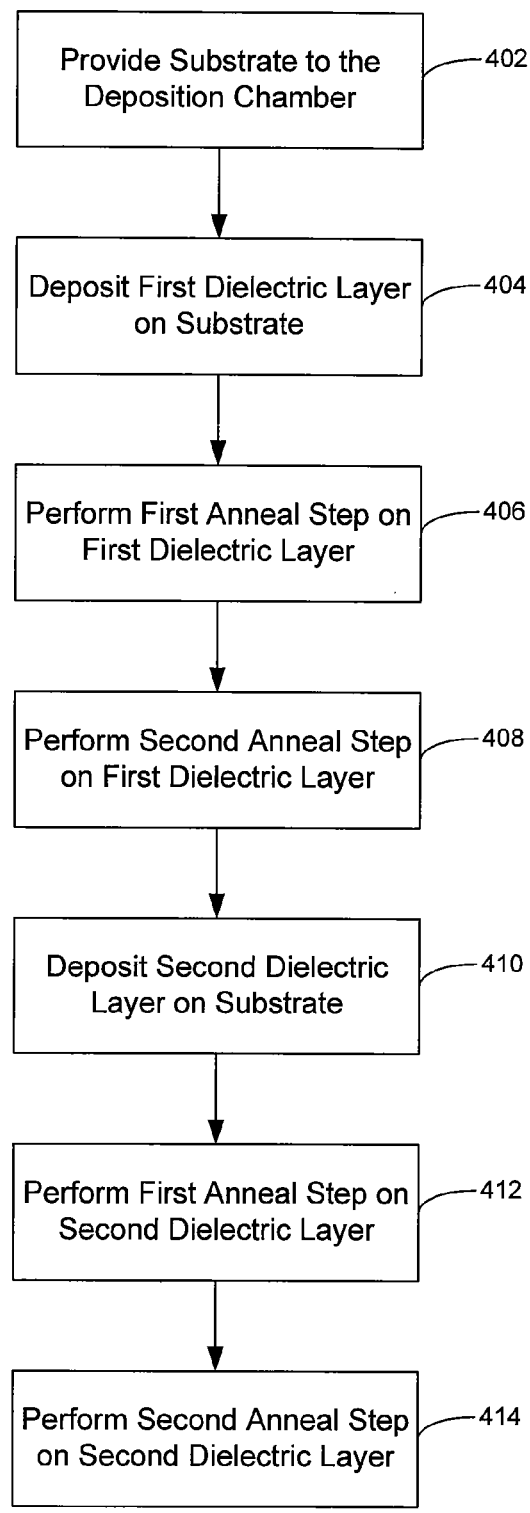
FIG. 4 is a flowchart showing selected steps in a multilayer dielectric deposition and thermal/plasma anneal according to embodiments of the invention.

Referring now to FIG. 4, a flowchart with selected steps in a multilayer dielectric deposition and thermal/plasma anneal 400 according to embodiments of the invention is shown. The method 400 includes providing a substrate to a deposition chamber 402, and depositing a first dielectric layer on the substrate 404. The dielectric layer may be a silicon oxide layer formed by the reaction of an atomic oxygen and organo-silicon precursor. The atomic oxygen precursor may be remotely generated by the high-density plasma dissociation of an oxygen containing gas, such as $O_2$. The thickness of the first oxide layer may be about 50 Å to about 500 Å (e.g., about 100 Å to about 200 Å).

Following the deposition, the first dielectric layer may be annealed in a two-step annealing process. The first anneal step 406 may include a UV or thermal anneal to increase the hardness of the layer. Then, a second anneal step 408 may be performed to further remove moisture and silanol bonds from the layer. This may be a plasma anneal performed by exposing the dielectric layer to an inert plasma. The temperature of the dielectric layer may be maintained at about 300° C. to about 600° C. (e.g., about 350° C. to about 400° C.) during both steps of the anneal. The first and second anneal of the first dielectric layer may last from about 30 seconds to about 10 minutes.

A second dielectric layer may then be formed 410 on the substrate that now has the first dielectric layer. The second dielectric layer may be formed from the same precursors (e.g., atomic oxygen and organo-silicon precursors) as the first dielectric layer. The second dielectric may also be formed with about the same thickness as the first layer (e.g., about 50 Å to about 500 Å).

Following the deposition, the second dielectric layer may be annealed in a two-step annealing process. The first anneal step 412 may include a UV or thermal anneal to increase the hardness of the layer, and to reduce the moisture and silanol levels in the film. Then, a second anneal step 414 may be performed to further remove moisture and silanol bonds from the layer. This may be a plasma anneal performed by exposing the dielectric layer to an inert plasma. The temperature of the dielectric layer may be maintained at about 300° C. to about 600° C. (e.g., about 350° C. to about 400° C.) during both steps of the anneal. The first and second anneal of the second dielectric layer may last from about 30 seconds to about 10 minutes.

The dielectric deposition and two-stage anneal cycle may be performed for several more iterations (not shown) until the dielectric material is formed to a desired thickness. For example, if each dielectric layer is 100 Å thick, and the desired total dielectric thickness is 1.2 µm, then 12 deposition and anneal cycles should be done. The thickness of each deposited layer may be set by controlling the parameters that effect the oxide deposition rate, such as the types and flow rates of the reactive precursors, the total pressure in the deposition chamber, and the temperature, among other parameters. As noted above, typical deposition rates for the oxide layers are about 500 Å/min to about 3000 Å/min (e.g., about 1500 Åm/min).

Exemplary Deposition and Anneal System

Deposition systems that may implement embodiments of the present invention may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems, available from Applied Materials, Inc. of Santa Clara, Calif.

One suitable deposition and anneal system in which can be modified to utilize embodiments in accordance with the present invention is shown and described in co-assigned U.S. Patent Pub. No. US2005/0250340 (U.S. application Ser. No. 10/841,582) by Chen et al, filed May 7, 2004, which is incorporated herein by reference for all purposes.

Figure 5A:
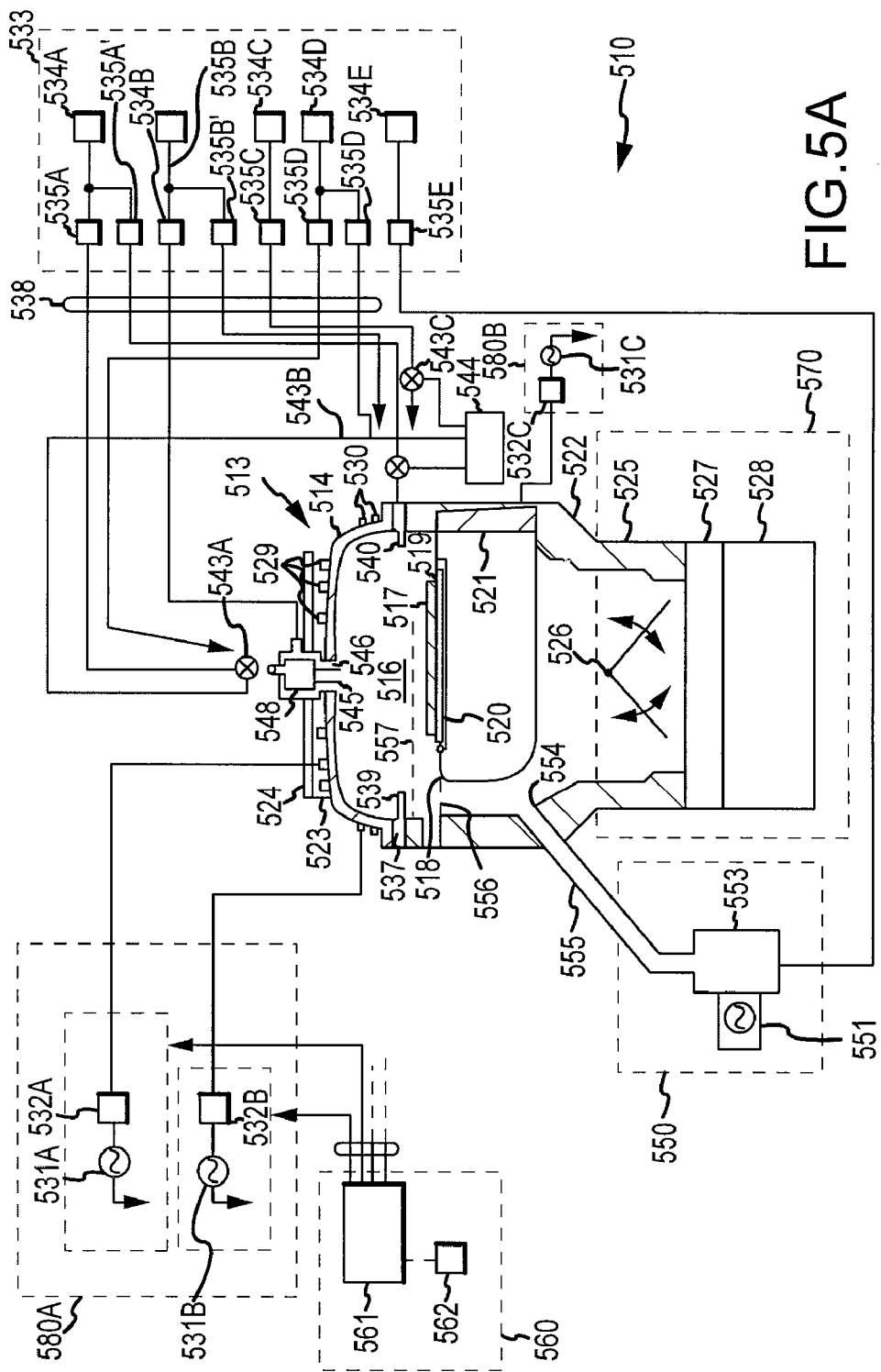
FIG. 5A is a simplified diagram of a high-density plasma chemical vapor deposition (HDPCVD) system according to embodiments of the invention.

Referring now to FIG. 5A, an embodiment of a high density plasma chemical vapor deposition (HDP-CVD) system 510 in which a seasoning film according to the present invention may be deposited on the aluminum nitrate components (e.g., nozzles, baffles, etc.). System 510 includes a chamber 513, a vacuum system 570, a source plasma system 580A, a bias plasma system 580B, a gas delivery system 533, and a remote plasma cleaning system 550.

The upper portion of chamber 513 includes a dome 514, which is made of a ceramic dielectric material, such as aluminum nitride. Dome 514 defines an upper boundary of a plasma processing region 516. Plasma processing region 516 is bounded on the bottom by the upper surface of a substrate 517 and a substrate support member 518.

A heater plate 523 and a cold plate 524 surmount, and are thermally coupled to, dome 514. Heater plate 523 and cold plate 524 allow control of the dome temperature to within about ±10° C. over a range of about 100° C. to about 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 513 includes a body member 522, which joins the chamber to the vacuum system. A base portion 521 of substrate support member 518 is mounted on, and forms a continuous inner surface with, body member 522. Substrates are transferred into and out of chamber 513 by a robot blade (not shown) through an insertion/removal opening (not shown) in the side of chamber 513. Lift pins (not shown) are raised and then lowered under the control of a motor (also not shown) to move the substrate from the robot blade at an upper loading position 557 to a lower processing position 556 in which the substrate is placed on a substrate receiving portion 519 of substrate support member 518. Substrate receiving portion 519 includes an electrostatic chuck 520 that secures the substrate to substrate support member 518 during substrate processing. In one embodiment, substrate support member 518 is made from an aluminum ceramic (e.g., AlN) material.

Vacuum system 570 includes throttle body 525, which houses twin-blade throttle valve 526 and is attached to gate valve 527 and turbo-molecular pump 528. It should be noted that throttle body 525 offers minimum obstruction to gas flow, and allows symmetric pumping, as described in co-assigned U.S. patent application Ser. No. 08/574,839, filed Dec. 12, 1995, and which is incorporated herein by reference. Gate valve 527 can isolate pump 528 from throttle body 525, and can also control chamber pressure by restricting the exhaust flow capacity when throttle valve 526 is fully open. The arrangement of the throttle valve, gate valve, and turbo-molecular pump allow accurate and stable control of chamber pressures from between about 1 mTorr to about 2 Torr.

The source plasma system 580A includes a top coil 529 and side coil 530, mounted on dome 514. A symmetrical ground shield (not shown) reduces electrical coupling between the coils. Top coil 529 is powered by top source RF (SRF) generator 131A, whereas side coil 530 is powered by side SRF generator 531B, allowing independent power levels and frequencies of operation for each coil. This dual coil system allows control of the radial ion density in chamber 513, thereby improving plasma uniformity. Side coil 530 and top coil 529 are typically inductively driven, which does not require a complimentary electrode. In one embodiment, the top source RF generator 531A provides up to 10,000 watts of RF power at nominally 2 MHz and the side source RF generator 531B provides up to 10,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 580B includes a bias RF (BRF) generator 531C and a bias matching network 532C. The bias plasma system 580B capacitively couples substrate portion 517 to body member 522, which act as complimentary electrodes. The bias plasma system 580B serves to enhance the transport of plasma species (e.g., ions) created by the source plasma system 580A to the surface of the substrate. In a specific embodiment, bias RF generator provides up to 5,000 watts of RF power at 13.56 MHz.

RF generators 531A and 531B include digitally-controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 532A and 532B match the output impedance of generators 531A and 531B with their respective coils 529 and 530. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 5B:
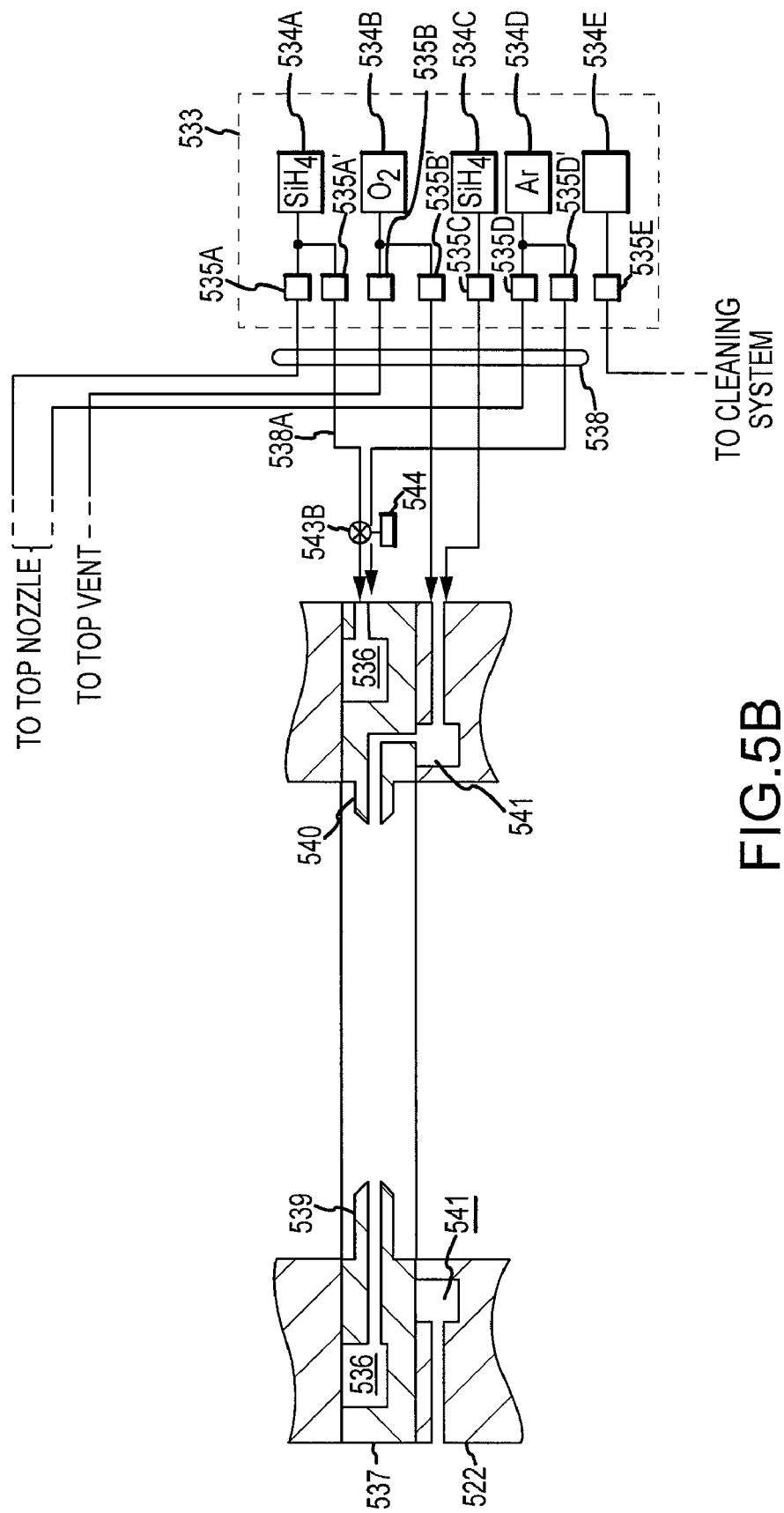
FIG. 5B is a simplified cross-section of an example of gas ring that may be used in conjunction with an HDP-CVD system according to embodiments of the invention.

A gas delivery system 533 provides gases from several sources, 534A-534F chamber for processing the substrate via gas delivery lines 538 (only some of which are shown). As would be understood by a person of skill in the art, the actual sources used for sources 534A-534F and the actual connection of delivery lines 538 to chamber 513 varies depending on the deposition and cleaning processes executed within chamber 513. Gases are introduced into chamber 513 through a gas ring 537 and/or a top nozzle 545. The gas ring 537 and/or top nozzle 545 may be made from AlN. FIG. 5B is a simplified, partial cross-sectional view of chamber 513 showing additional details of gas ring 537.

In one embodiment, first and second gas sources, 534A and 534B, and first and second gas flow controllers, 535A' and 535B', provide gas to ring plenum 536 in gas ring 537 via gas delivery lines 538 (only some of which are shown). Gas ring 537 has a plurality of gas nozzles 539 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In one embodiment, gas ring 537 has one hundred twelve gas nozzles 539 made from aluminum nitride.

Gas ring 537 also has a plurality of gas nozzles 540 (only one of which is shown), which may be co-planar with and shorter than source gas nozzles 539, and in one embodiment receive gas from body plenum 541. Gas nozzles 540 may be made from AlN. Gas nozzles 539 and 540 are not fluidly coupled in some embodiments it is desirable not to mix gases before injecting the gases into chamber 513. In other embodiments, gases may be mixed prior to injecting the gases into chamber 513 by providing apertures (not shown) between body plenum 541 and gas ring plenum 536. In one embodiment, third and fourth gas sources, 534C and 534D, and third and fourth gas flow controllers, 535C and 535D', provide gas to body plenum via gas delivery lines 538. Additional valves, such as 543B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 543B, to isolate chamber 513 from delivery line 538A and to vent delivery line 538A to vacuum foreline 544, for example. As shown in FIG. 5A, other similar valves, such as 543A and 543C, may be incorporated on other gas delivery lines. Such 3-way valves may be placed as close to chamber 513 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 5A, chamber 513 also has top nozzle 545 (which may be made from AlN) and top vent 546. Top nozzle 545 and top vent 546 allow independent control of top and side flows of the gases, which improves film uniformity and allows fine adjustment of the film's deposition and doping parameters. Top vent 546 is an annular opening around top nozzle 545. In one embodiment, first gas source 534A supplies source gas nozzles 539 and top nozzle 545. Source nozzle MFC 535A' controls the amount of gas delivered to source gas nozzles 539 and top nozzle MFC 535A controls the amount of gas delivered to top gas nozzle 545. Similarly, two MFCs 535B and 535B' may be used to control the flow of oxygen to both top vent 546 and oxidizer gas nozzles 540 from a single source of oxygen, such as source 534B. The gases supplied to top nozzle 545 and top vent 546 may be kept separate prior to flowing the gases into chamber 513, or the gases may be mixed in top plenum 48 before they flow into chamber 513. Separate sources of the same gas may be used to supply various portions of the chamber.

A remote microwave-generated plasma cleaning system 550 is provided to periodically clean deposition residues from chamber components. The cleaning system includes a remote microwave generator 551 that creates a plasma from a cleaning gas source 534E (e.g., molecular fluorine, nitrogen trifluoride, other fluorocarbons or equivalents) in reactor cavity 553. The reactive species resulting from this plasma are conveyed to chamber 513 through cleaning gas feed port 554 via applicator tube 555. The materials used to contain the cleaning plasma (e.g., cavity 553 and applicator tube 555) should be resistant to attack by the plasma. The distance between reactor cavity 553 and feed port 554 should be kept as short as practical, since the concentration of desirable plasma species may decline with distance from reactor cavity 553. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 520, do not need to be covered with a dummy wafer or otherwise protected, as may be required with an in situ plasma cleaning process.

System controller 560 controls the operation of system 510. Controller 560 may include a memory 562, such as a hard disk drive, a floppy disk drive (not shown), and a card rack (not shown) coupled to a processor 561. The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure as having a 16-bit data bus and 24-bit address bus. System controller 531 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube (CRT) 565, and a light pen 566, as depicted in FIG. 5C.

Figure 5C:
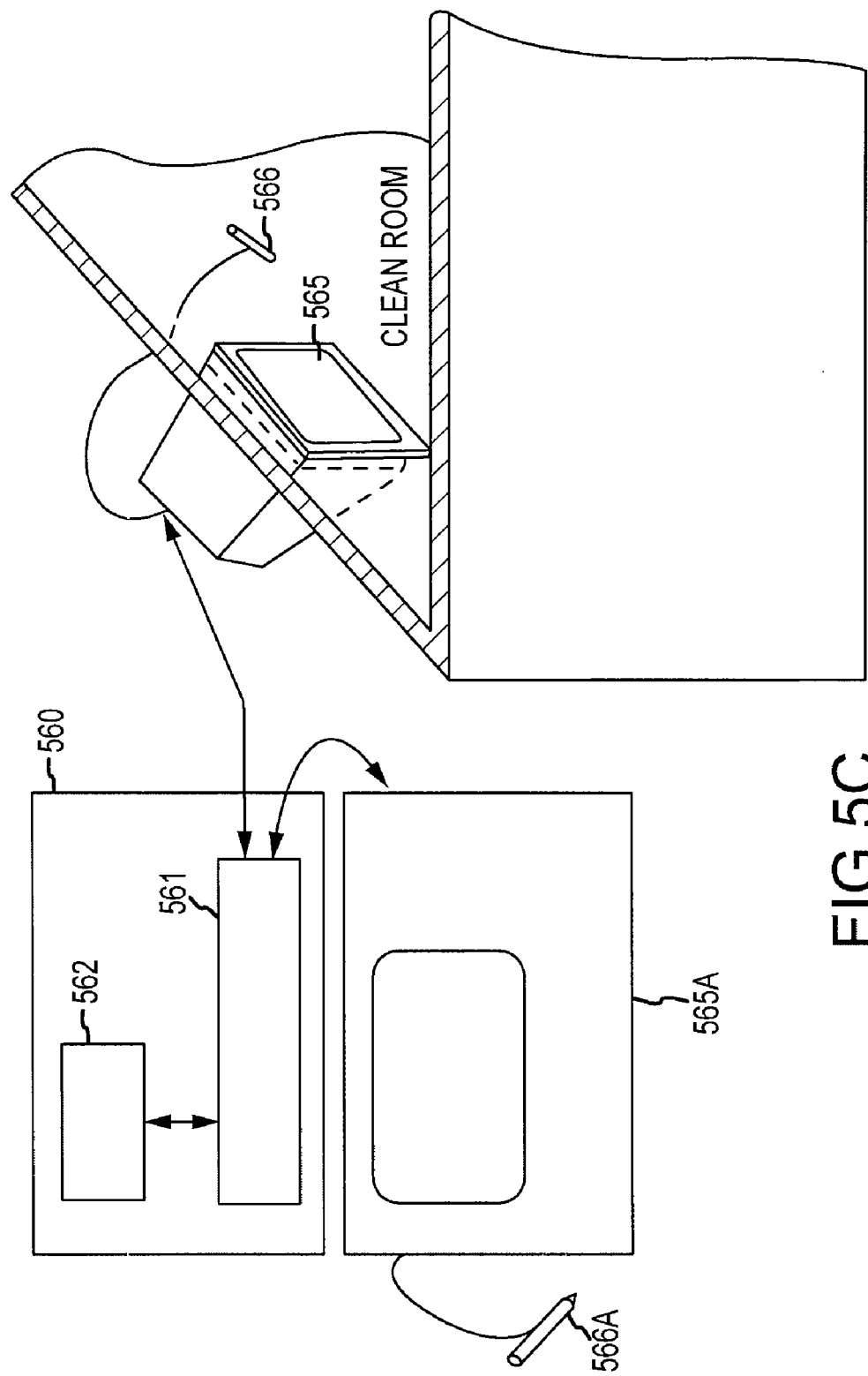
FIG. 5C is a simplified diagram of an example of a monitor and light pen system that may be used in conjunction with an HDP-CVD system according to embodiments of the invention.

FIG. 5C is an illustration of a portion of an exemplary system user interface used in conjunction with the exemplary CVD processing chamber of FIG. 5A. System controller 560 includes a processor 561 coupled to a computer-readable memory 562. Preferably, memory 562 may be a hard disk drive, but memory 562 may be other kinds of memory, such as ROM, PROM, and others.

System controller 560 operates under the control of a computer program 563 stored in a computer-readable format within memory 562. The computer program dictates the timing, temperatures, gas flows, RF power levels and other parameters of a particular process. The interface between a user and the system controller is via a CRT monitor 565 and a light pen 566, as depicted in FIG. 5C. Two monitors, 565 and 565A, and two light pens, 566 and 566A, may be used, one mounted in the clean room wall (565) for the operators and the other behind the wall (565A) for the service technicians. Both monitors simultaneously display the same information, while one light pen (e.g. 566) may be enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, Java, and Pascal, among others. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 5D:
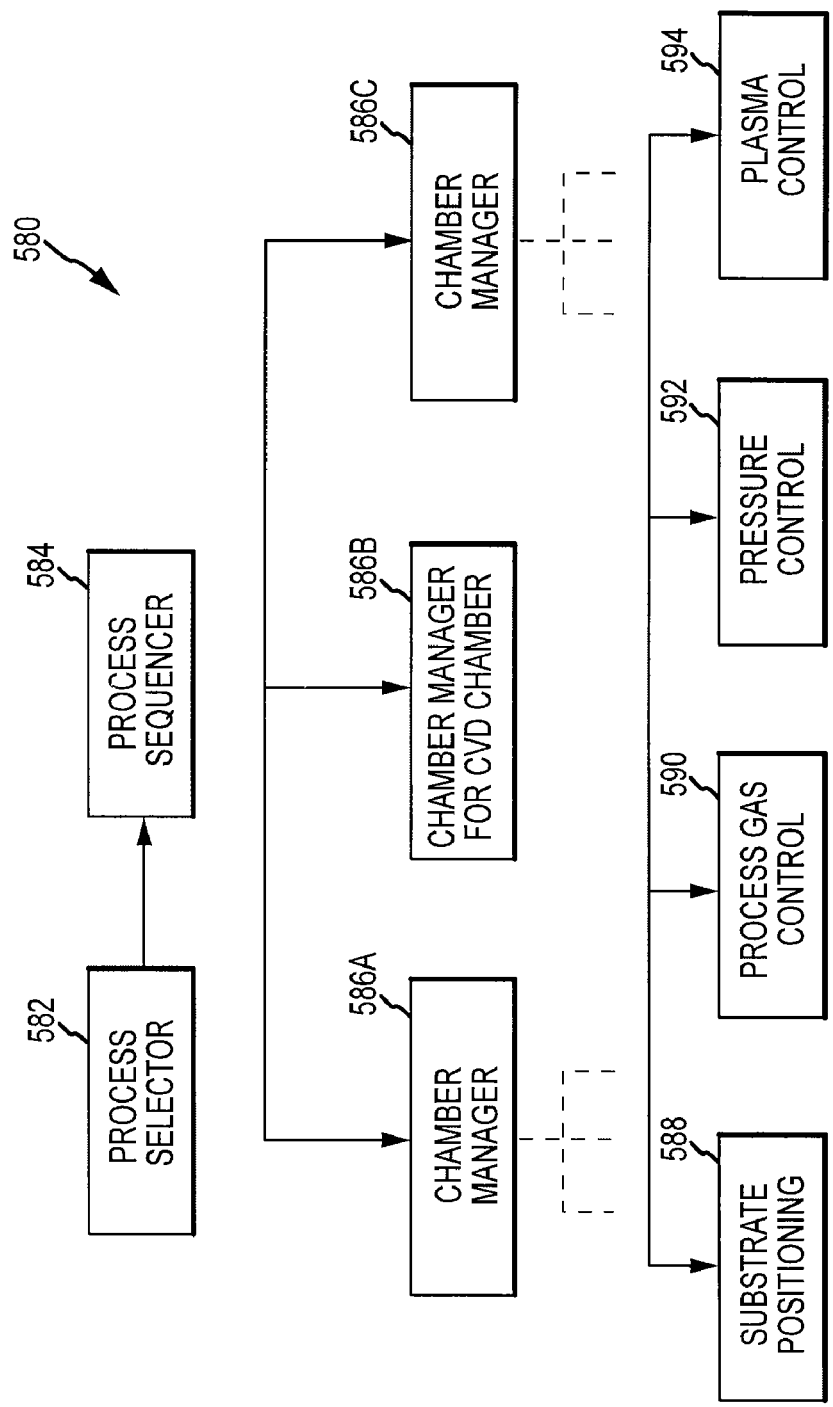
FIG. 5D is a simplified schematic of an example of a process controller to control an HDP-CVD system according to embodiments of the invention.

FIG. 5D shows an illustrative block diagram of the hierarchical control structure of computer program 580. A user enters a process set number and process chamber number into a process selector subroutine 582 in response to menus or screens displayed on the CRT monitor by using the light pen interface. The process sets are predetermined sets of process parameters necessary to carry out specified processes, and are identified by predefined set numbers. Process selector subroutine 582 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 560, and the signals for controlling the process are output on the analog and digital output boards of system controller 560.

A process sequencer subroutine 584 comprises program code for accepting the identified process chamber and set of process parameters from the process selector subroutine 582 and for controlling operation of the various process chambers. Multiple users can enter process set numbers and process chamber numbers, or a single user can enter multiple process set numbers and process chamber numbers; sequencer subroutine 584 schedules the selected processes in the desired sequence. Preferably, sequencer subroutine 584 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 584 can be designed to take into consideration the "age of each particular user-entered request, or the present condition of the process chamber being used in comparison with the desired process conditions for a selected process, or any other relevant factor a system programmer desires to include for determining scheduling priorities.

After sequencer subroutine 584 determines which process chamber and process set combination is going to be executed next, sequencer subroutine 584 initiates execution of the process set by passing the particular process set parameters to a chamber manager subroutine 586A-C, which controls multiple processing tasks in chamber 513 and possibly other chambers (not shown) according to the process set sent by sequencer subroutine 584.

Examples of chamber component subroutines are substrate positioning subroutine 588, process gas control subroutine 590, pressure control subroutine 592, and plasma control subroutine 594. Those having ordinary skill in the art will recognize that other chamber control subroutines can be included depending on what processes are selected to be performed in chamber 513. In operation, chamber manager subroutine 586B selectively schedules or calls the process component subroutines in accordance with the particular process set being executed. Chamber manager subroutine 586B schedule process component subroutines in the same manner that sequencer subroutine 584 schedules the process chamber and process set to execute. Typically, chamber manager subroutine 586B includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 5A and 5D. Substrate positioning subroutine 588 comprises program code for controlling chamber components that are used to load a substrate onto substrate support number 518. Substrate positioning subroutine 588 may also control transfer of a substrate into chamber 513 from, e.g., a PECVD reactor or other reactor in the multi-chamber system, after other processing has been completed.

Process gas control subroutine 590 has program code for controlling process gas composition and flow rates. Subroutine 590 controls the open/close position of the safety shut-off valves and also ramps up/ramps down the mass flow controllers to obtain the desired gas flow rates. All chamber component subroutines, including process gas control subroutine 590, are invoked by chamber manager subroutine 586B. Subroutine 590 receives process parameters from chamber manager subroutine 586B related to the desired gas flow rates.

Typically, process gas control subroutine 590 opens the gas supply lines, and repeatedly (i) reads the necessary mass flow controllers, (ii) compares the readings to the desired flow rates received from chamber manager subroutine 586B, and (iii) adjusts the flow rates of the gas supply lines as necessary. Furthermore, process gas control subroutine 590 may include steps for monitoring the gas flow rates for unsafe rates and for activating the safety shut-off valves when an unsafe condition is detected.

In some processes, an inert gas, such as argon, is flowed into chamber 513 to stabilize the pressure in the chamber before reactive process gases are introduced. For these processes, the process gas control subroutine 590 is programmed to include steps for flowing the inert gas into chamber 513 for an amount of time necessary to stabilize the pressure in the chamber. The steps described above may then be carried out.

Additionally, when a process gas is to be vaporized from a liquid precursor, for example, tetraethylorthosilane (TEOS), octamethylcyclotetrasiloxane (OMCTS), etc., the process gas control subroutine 590 may include steps for bubbling a delivery gas such as helium through the liquid precursor in a bubbler assembly or for introducing the helium to a liquid injection valve. For this type of process, the process gas control subroutine 590 regulates the flow of the delivery gas, the pressure in the bubbler, and the bubbler temperature to obtain the desired process gas flow rates. As discussed above, the desired process gas flow rates are transferred to process gas control subroutine 590 as process parameters.

Furthermore, the process gas control subroutine 590 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 590 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 592 includes program code for controlling the pressure in chamber 513 by regulating the size of the opening of throttle valve 526 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 526 to a fixed position. Setting throttle valve 526 to a fixed position may eventually result in a steady-state pressure.

Alternatively, the chamber pressure may be measured, with a manometer for example, and the position of throttle valve 526 may be adjusted according to pressure control subroutine 592, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 592 is invoked, the desired, or target, pressure level is received as a parameter from chamber manager subroutine 586B. Pressure control subroutine 592 measures the pressure in chamber 513 by reading one or more conventional pressure manometers connected to the chamber; compares the measured value(s) to the target pressure; obtains proportional, integral, and differential (PID) values from a stored pressure table corresponding to the target pressure, and adjusts throttle valve 526 according to the PID values obtained from the pressure table. Alternatively, pressure control subroutine 592 may open or close throttle valve 526 to a particular opening size to regulate the pressure in chamber 513 to a desired pressure or pressure range.

Plasma control subroutine 594 comprises program code for controlling the frequency and power output setting of RF generators 531A and 531B and for tuning matching networks 532A and 532B. Plasma control subroutine 594, like the previously described chamber component subroutines, is invoked by chamber manager subroutine 586B.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of making a silicon oxide layer on a substrate, the method comprising:
    forming the silicon oxide layer on the substrate in a reaction chamber by reacting atomic oxygen with a silicon precursor and depositing reaction products on the substrate, wherein the atomic oxygen is generated outside the reaction chamber;
    heating the silicon oxide layer at a temperature of about 600° C. or less; and
    exposing the silicon oxide layer to an induced coupled plasma.

2. The method of claim 1, wherein the silicon oxide layer is heated to a temperature from about 300° C. to about 600° C.

3. The method of claim 1, wherein the silicon oxide layer is heated to about 380° C.

4. The method of claim 1, wherein the silicon oxide layer is heated for about 1 minute to about 30 minutes.

5. The method of claim 1, wherein the silicon oxide layer is heated for about 1 minute.

6. The method of claim 1, wherein the plasma comprises a helium or argon precursor.

7. The method of claim 1, wherein the silicon oxide layer is heated for about 1 minute to about 30 minutes before being exposed to the induced coupled plasma.

8. The method of claim 1, wherein the silicon oxide layer is heated in the reaction chamber in a nitrogen atmosphere at a pressure of about 15 mTorr to about 760 Torr.

9. The method of claim 8, wherein the pressure is about 50 Torr.

10. The method of claim 1, wherein the silicon oxide layer has a temperature of about 300° C. to about 600° C. during the exposure to the plasma.

11. The method of claim 10, wherein the temperature is about 380° C.

12. The method of claim 1, wherein an RF power source operating at a power level of about 1000 Watts to about 9600 Watts is used to generate the plasma.

13. The method of claim 12, wherein the power level is about 1800 Watts.

14. The method of claim 1, wherein the reaction chamber has a pressure of about 2 mTorr to about 50 mTorr during the exposure of the silicon oxide layer to the plasma.

15. The method of claim 14, wherein the chamber pressure is about 20 mTorr.

16. The method of claim 1, wherein the silicon oxide layer is exposed to the plasma for about 1 minute to about 10 minutes.

17. The method of claim 16, wherein the silicon oxide layer is exposed to the plasma for about 3 minutes.

18. A method of forming a silicon oxide layer on a substrate, the method comprising:
   forming the silicon oxide layer on the substrate in a reaction chamber by reacting atomic oxygen with a silicon precursor and depositing reaction products on the substrate, wherein the atomic oxygen is generated outside the reaction chamber;
   exposing the silicon oxide layer to ultra-violet light; and
   exposing the silicon oxide layer to an induced coupled plasma.

19. The method of claim 18, wherein the silicon oxide layer has a temperature of about 25° C. to about 900° C. during the exposure to the ultra-violet light.

20. The method of claim 18, wherein the silicon oxide layer has a temperature of about 300° C. to about 600° C. during the exposure to the ultra-violet light.

21. The method of claim 18, wherein the ultra-violet light has a peak wavelength intensity at about 220 nm.

22. The method of claim 18, wherein the silicon oxide is exposed to the ultra-violet light for about 10 second to about 60 minutes.

23. The method of claim 18, wherein the silicon oxide is exposed to the ultra-violet light for about 30 minutes.

24. The method of claim 18, wherein the silicon oxide is exposed to the ultra-violet light in an atmosphere comprising helium, argon, N2, N2O, ammonia, ozone, or H2O.

25. The method of claim 24, wherein the pressure of the atmosphere in the reaction chamber is about 1 Torr to about 600 Torr.

26. A method of depositing and annealing a silicon oxide layer on a wafer substrate, the method comprising:
   providing the substrate wafer to an HDP-CVD process chamber where the deposition of the silicon oxide layer occurs;
   providing a remote plasma generation unit outside the HDP-CVD process chamber, wherein the remote plasma generation unit is used to generate atomic oxygen that is supplied to the HDP-CVD process chamber;
   supplying a silicon precursor to the HDP-CVD process chamber, wherein the silicon precursor and the atomic oxygen react to form the silicon oxide layer on the wafer;
   performing a first anneal on the deposited silicon oxide layer, wherein the first anneal comprises heating the layer to a temperature of about 300° C. to about 600° C. for about 1 minute to about 30 minutes; and
   performing a second anneal on the deposited oxide layer, wherein the second anneal comprises exposing the layer to a high-density argon plasma for about 1 minute to about 10 minutes.

27. The method of claim 26, wherein the first and second anneals are performed in about 4 minutes to about 10 minutes.

28. The method of claim 26, wherein the first anneal is performed for about 1 minute and the second anneal is performed for about 3 minutes.

29. The method of claim 26, wherein the first and second anneals are performed at about 380° C.

30. The method of claim 26, wherein the silicon precursor is selected from the group consisting of octamethylcyclotetrasiloxane (OMCTS), tetramethoxysilane (TMOS), and a mixture of OMCTS and TMOS.

31. The method of claim 26, wherein the atomic oxygen is generated by plasma dissociated of molecular oxygen in the remote plasma generation unit.

32. The method of claim 26, wherein the substrate wafer is held at a temperature of about 30° C. to about 75° C. during the formation of the silicon oxide layer.

* * * * *